United States Patent
Agneray et al.

(10) Patent No.: US 7,768,323 B2
(45) Date of Patent: Aug. 3, 2010

(54) DEVICE FOR CONTROLLING A HIGH-VOLTAGE TRANSISTOR, IN PARTICULAR A MOS TRANSISTOR OF A HIGH-VOLTAGE RADIO-FREQUENCY GENERATOR FOR THE SPARK IGNITION OF AN INTERNAL COMBUSTION ENGINE

(75) Inventors: Andre Agneray, Boulogne (FR); Clement Nouvel, Clamart (FR)

(73) Assignee: Renault S.A.S., Boulogne Billancourt (FR)

( * ) Notice: Subject to any disclaimer, the term of this patent is extended or adjusted under 35 U.S.C. 154(b) by 0 days.

(21) Appl. No.: 11/994,716

(22) PCT Filed: May 12, 2006

(86) PCT No.: PCT/FR2006/050435

§ 371 (c)(1),
(2), (4) Date: Feb. 27, 2008

(87) PCT Pub. No.: WO2007/006984

PCT Pub. Date: Jan. 18, 2007

(65) Prior Publication Data

US 2008/0309381 A1    Dec. 18, 2008

(30) Foreign Application Priority Data

Jul. 6, 2005   (FR) .................................. 05 07211

(51) Int. Cl.
*H03B 1/00*   (2006.01)
(52) U.S. Cl. ........................ 327/108; 327/112
(58) Field of Classification Search .......... 327/108–112, 327/318–320, 324–327, 379–384, 389–391; 326/82–84, 86, 88–90

See application file for complete search history.

(56) References Cited

U.S. PATENT DOCUMENTS

| | | | |
|---|---|---|---|
| 4,806,797 A * | 2/1989 | Yamazaki | 326/64 |
| 5,113,839 A | 5/1992 | Hartmann et al. | 123/606 |
| 5,634,453 A | 6/1997 | Taruya et al. | 123/645 |
| 5,789,951 A | 8/1998 | Shen et al. | 327/110 |
| 6,242,973 B1 * | 6/2001 | Kong et al. | 327/589 |
| 6,535,021 B1 * | 3/2003 | Song | 326/121 |
| 6,703,883 B2 * | 3/2004 | West et al. | 327/291 |
| 2002/0093372 A1 | 7/2002 | Theobald et al. | 327/478 |

FOREIGN PATENT DOCUMENTS

| | | |
|---|---|---|
| EP | 0 903 857 | 3/1999 |
| FR | 2 859 831 | 3/2005 |
| JP | 58 008267 | 1/1983 |

* cited by examiner

*Primary Examiner*—An T Luu
(74) *Attorney, Agent, or Firm*—Oblon, Spivak, McClelland, Maier & Neustadt, L.L.P.

(57) ABSTRACT

A control device including: an input terminal for receiving a logic control signal; an output terminal for delivering an output control signal from the high-voltage MOS transistor; a first NMOS control transistor with low internal impedance, which is connected between ground and the output terminal and the gate of which is connected to the input terminal; and a second PMOS control transistor, which is connected between a supply terminal and the output terminal and the gate of which is connected to the input terminal by a bipolar transistor mounted to a common base, and which is current controlled at the emitter thereof by a capacitive connecting circuit.

11 Claims, 3 Drawing Sheets

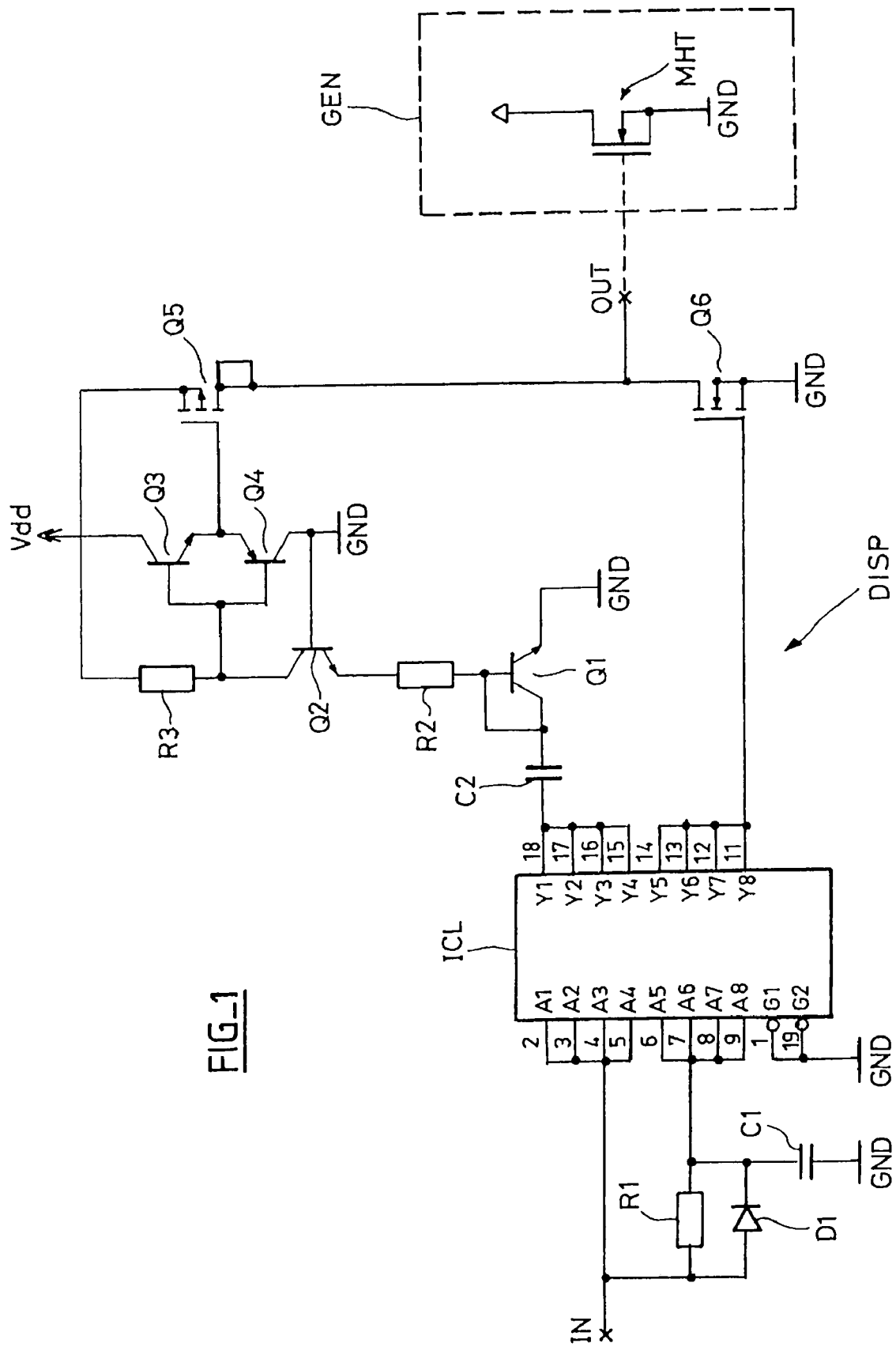
FIG_1

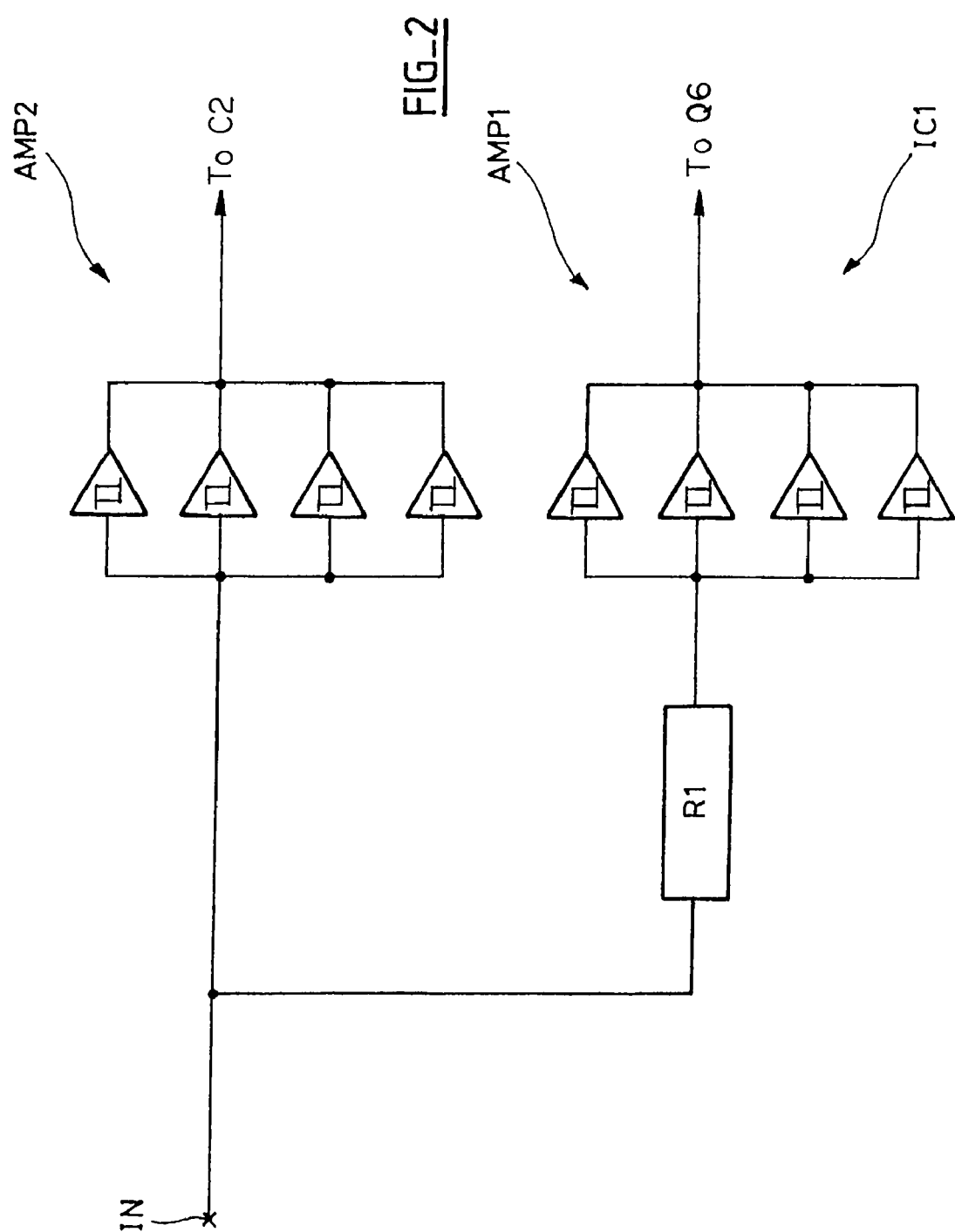
FIG_2

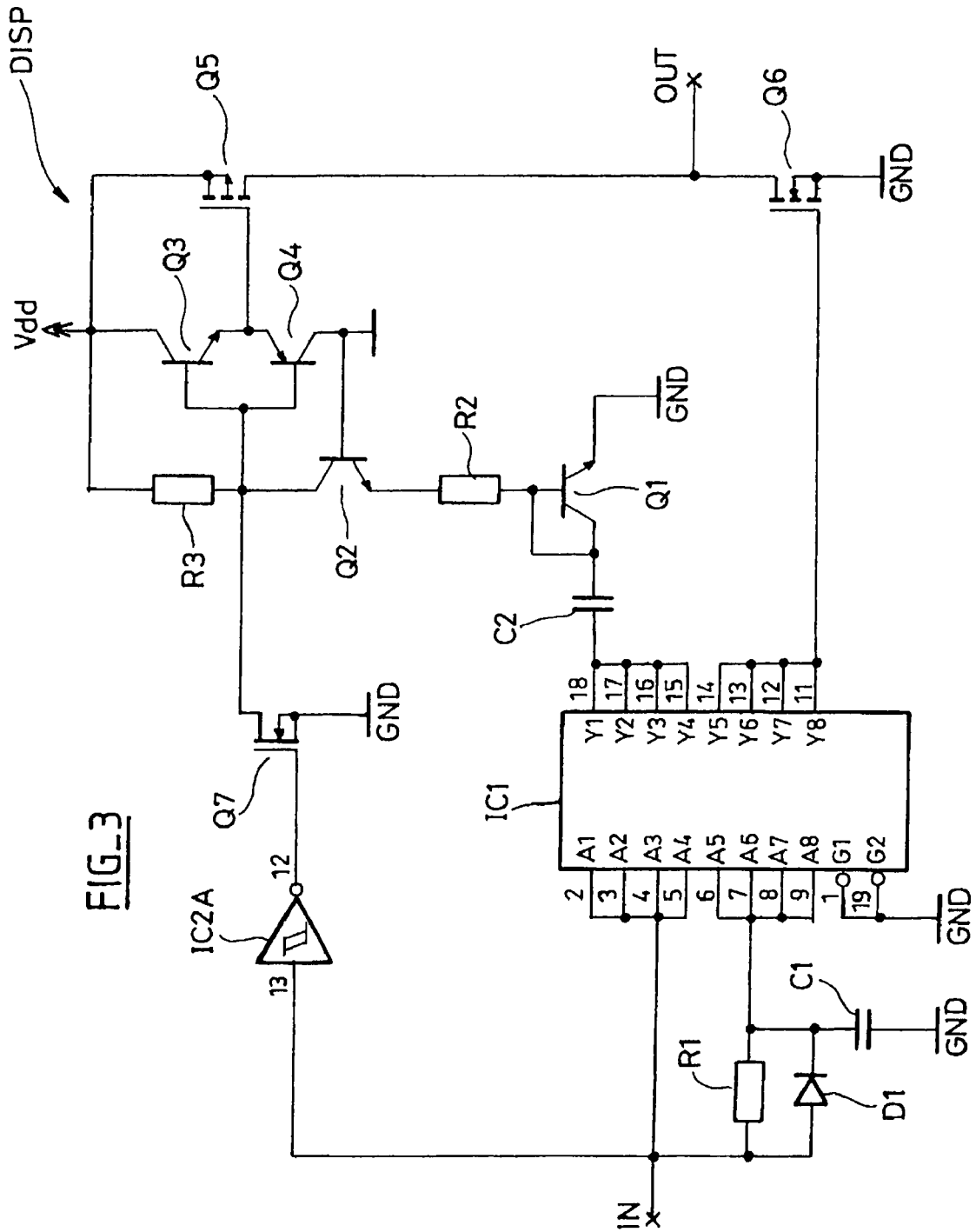
FIG_3

DEVICE FOR CONTROLLING A HIGH-VOLTAGE TRANSISTOR, IN PARTICULAR A MOS TRANSISTOR OF A HIGH-VOLTAGE RADIO-FREQUENCY GENERATOR FOR THE SPARK IGNITION OF AN INTERNAL COMBUSTION ENGINE

The invention relates to the driving of high-voltage transistors and especially those that have a high gate-drain capacitance and that have to be switched at frequencies of several MHz, as is for example the case with radiofrequency AC high-voltage generators (1 kV/20 A/5 MHz) for the spark ignition of an internal combustion engine. An example of such a transistor may be a MOS (metal oxide semiconductor) transistor.

Exemplary embodiments of such generators are for example described in French patent applications 2 859 869, 2 859 830 and 2 859 831 in the name of the Applicant.

The operation of a radiofrequency AC high-voltage generator requires a high-voltage transistor, having its source grounded, to be rapidly driven.

Now, the drivers currently used for driving such MOS transistors at high voltage and for switching frequencies of several MHz have, for most of them, propagation times between the input and the output that are too long for the envisioned feedback control mode.

Considering the required performance, in the prior art there are solutions based on transformers for applying, to the gate of the high-voltage transistor, a symmetrical voltage capable of turning off the transistor efficiently. However, these solutions are generally more expensive than circuits based on non-coiled active components.

The invention aims to provide a solution to this problem.

One object of the invention is to provide a driver for rapidly driving a transistor, in particular a high-voltage transistor for a radiofrequency AC high-voltage generator, capable of meeting a signal propagation time between the input and the output of around 15 to 20 ns, while still offering a unipolar architecture based on non-coiled active components.

According to one aspect of the invention, what is consequently proposed is an arrangement of the "push-pull" type with synchronized driving of two complementary MOS drive transistors.

More precisely, according to this aspect of the invention, what is proposed is a driver for driving a high-voltage transistor, in particular a MOS transistor of a radiofrequency high-voltage generator, which comprises:
  an input terminal for receiving a logic drive signal;
  an output terminal for delivering an output drive signal of the high-voltage transistor;
  an nMOS first drive transistor of low internal impedance, which is connected between ground and the output terminal and the gate of which is connected to said input terminal; and
  a pMOS second drive transistor which is connected between a supply terminal and the output terminal and the gate of which is connected to said input terminal via a bipolar transistor placed in a common base arrangement and current-controlled on its emitter by a capacitive coupling circuit.

Because of the Miller effect associated with the gate-drain capacitance of the transistor and for switching times of around 10 ns, currents of the order of about 10 amps appear on the gate of the high-voltage transistor when it is being turned off. It is therefore necessary, to prevent the transistor from being turned back on and oscillating, to have a drive circuit of low impedance with respect to ground, this being achieved here by the use of an NMOS drive transistor having a low internal impedance, typically less than 1 ohm, and preferably substantially less than 0.5 ohms.

Moreover, by driving the pMOS second drive transistor, especially via a bipolar transistor placed in a common base arrangement and current-controlled on its emitter by a capacitive coupling circuit, it is possible to ensure effective and rapid switching even when the supply voltage is low, something which may occur during start-up of a vehicle when the battery voltage may drop to below 8 V.

In one embodiment, the capacitive coupling circuit comprises a capacitor connected to said input terminal, a first resistor connected to the emitter of the bipolar transistor, and a diode-forming means connected in series between the first resistor and the capacitor.

Advantageously, the driver further includes a second resistor connected between the collector of the bipolar transistor and the supply terminal and forming, with the bipolar transistor, a level translator stage and also a follower stage connected between the level translator stage and the gate of the pMOS second drive transistor.

Moreover, it is preferable for the driver to further include a first amplifying circuit connected between the gate of the nMOS first drive transistor and the input terminal, and a second amplifying circuit connected between the input terminal and the capacitive coupling circuit.

These two amplifying circuits, which are for example produced by a MOS logic circuit of the 74AC family, make it possible, when this is necessary, to amplify, currentwise, the logic drive signal (which is for example a 0-5 volt signal) so as to deliver a sufficient current on the gates of the drive transistors at the moment of switching them.

Even though the pMOS drive transistor and the nMOS drive transistor do not in theory switch at the same instant, since their respective switching is associated with the high state or with the low state of the logic input drive signal, it may happen, given the propagation times within the circuit and given the switching frequency that these two drive transistors do nevertheless switch at the same time for a short instant. Although this is not a problem for the operation of the driver, this does result in dissipative loss. To remedy this drawback, provision is made for the driver to advantageously include a phase shift circuit connected between the input terminal and the gate of the nMOS first drive transistor, for example connected between the input terminal and the input of the first amplifying circuit, so as to offset the drive signals for the two drive transistors.

To increase the operating frequency range of the driver, and in particular to allow the driver to be used effectively at low frequency, it is advantageous for the driver to further include an additional amplifying circuit, the input of which is connected to said input terminal, and an additional nMOS transistor connected between ground and the connector of the bipolar transistor placed in a common base arrangement, the gate of which transistor is connected to the output of the additional amplifying circuit.

The driver as defined above is particularly applicable for driving a transistor of a radiofrequency high-voltage generator for the spark ignition of an internal combustion engine.

Another possible application is for driving a transistor of a radiofrequency high-voltage generator for plasma generation.

Other advantages and features of the invention will become apparent on examining the detailed description of nonlimiting embodiments, and the appended drawings in which:

FIG. 1 illustrates a first embodiment of a driver according to the invention;

FIG. 2 illustrates in greater detail part of the driver of FIG. 1; and

FIG. 3 illustrates another embodiment of a driver according to the invention.

In FIG. 1, the reference DISP denotes a driver for driving a high-voltage transistor MHT, having its source at ground GND and for example forming part of a radiofrequency AC high-voltage generator used for spark ignition of internal combustion engines.

The driver DISP has an input terminal IN capable of receiving a logic drive signal that may have a high logic state (for example 5 V) or a low logic state (for example 0 V).

The logic drive signal is delivered to the inputs 2, 3, 4 and 5 of a MOS logic circuit of the 74AC family, referenced IC1, for example the circuit 74AC 541 sold by Fairchild for example.

The logic drive signal is also delivered, via a phase shift circuit formed from the resistor R1, the diode D1 and the capacitor C1, to four other inputs of the circuit IC1, namely the inputs 6, 7, 8 and 9, the functionality of said phase shift circuit being discussed in detail later.

As illustrated more particularly in FIG. 2, the inputs 6, 7, 8 and 9 are connected to four ports of the AC14 family type connected in parallel and forming a first amplifying circuit AMP1.

Likewise, the inputs 2, 3, 4 and 5 are connected to four other ports AC14, again connected in parallel and forming a second amplifying circuit AMP2.

Each of these logic ports is capable of delivering a current of 50 mA as output, thereby making it possible to obtain, as output of each amplifying circuit AMP2, a current of 200 mA that allows the drive transistors, which will be explained in detail later, to be driven correctly.

The output of the first amplifying circuit AMP1 is connected directly to the gate of a first drive transistor Q6, which is an nMOS transistor.

This first drive transistor Q6 has an extremely low internal impedance relative to ground. By way of indication, a transistor with the reference PHP3055 sold by Philips will for example be chosen, this having an internal impedance of around 0.1 ohms.

Although the source of the transistor Q6 is connected to ground, its drain is connected to the output terminal OUT of the driver DISP.

The output of the second amplifying circuit AMP2 is connected to a capacitive coupling circuit—a signal symmetrizer—formed from a capacitor C2, from a transistor Q1 connected as a high-speed diode, and from a resistor R2, these three components being connected in series with the output of the second amplifying circuit AMP2.

This capacitive coupling circuit makes it possible to drive, via the current on its emitter, a bipolar transistor Q2 placed in a common base arrangement, that is to say with its base connected to ground.

The collector of the transistor Q2 is connected via a resistor R3 to the supply voltage Vdd, which is for example the battery voltage. The transistor Q2 and the resistor R3 thus form a level translator stage.

The collector of the transistor Q2 is connected to the gate of a second drive transistor Q5, which is a pMOS transistor, via a follower stage conventionally consisting of two transistors Q3 and Q4.

The pMOS transistor Q5 is connected between the supply voltage Vdd and the output terminal OUT.

The transistor Q5, which has a threshold voltage of around 5 V and is easily drivable at a voltage of 10 V, is for example a transistor with the reference IRFD9110 sold by International Rectifier.

The transistor Q2, current-driven on its emitter and having its gate connected to ground, makes it possible to achieve very rapid switching.

Moreover, to keep the possibility of rapid switching even when the supply voltage is low (at start-up of a vehicle the battery voltage may drop to less than 8 V), it is advantageous to use the common base arrangement, that is to say the base of Q2 is grounded. Subsequently, there must be a negative voltage on its emitter to ensure that it switches, this being achieved by the capacitive coupling circuit C2/Q1/R2.

Thus, during a positive half-cycle on the input terminal, that is to say when the input logic drive signal charges to the high state, the capacitor C2 charges up through the transistor Q1, which is used as a high-speed diode, until a voltage of the order of the difference between the supply voltage of the MOS logic circuit IC1 and the threshold voltage of the diode.

When the input signal changes to the low logic state, the output of the circuit IC1 also changes to an almost zero voltage and the voltage across the terminals of the capacitor C2 makes it possible to impose a negative potential on the resistor R2 and therefore to switch the transistor Q2 very suddenly. The pMOS drive transistor Q5 is then turned on a few nanoseconds later.

However, when the input logic signal is in the high state, the transistor Q5 is in the off-state while the transistor Q6 is in the on-state.

This being the case, to ensure that the two drive transistors Q5 and Q6 do not switch at the same time, it is advantageous to use the phase shift circuit formed from the resistor R1 in parallel with the diode D1 and with the capacitor C1, which allows the logic drive signal delivered at the input of the first amplifying circuit AMP1 to be temporally shifted with respect to that delivered at the input of the second amplifying circuit AMP2, these two circuits AMP1 and AMP2 being produced in the MOS logic circuit IC1.

When the transistor Q6 is in the on-state, the high-voltage MOS transistor MHT is in the off-state. Therefore a large current pulse appears on the gate of the transistor MHT. However, because of the low internal impedance of the transistor Q6, this large current pulse does not result in a voltage on the gate of the transistor MHT high enough to turn it back on, which would then result in undesirable oscillation of the transistor MHT.

In other words, the low internal impedance of the drive transistor Q6 makes it possible to ensure that the high-voltage transistor MHT is correctly in the off-state.

The driver shown in FIG. 1 has a propagation time between the input IN and the output OUT of around 20 ns with a rise time of around 15 ns.

The embodiment of the driver shown in FIG. 1 is particularly suitable for high-frequency operation. This being so, to increase the bandwidth of the driver, that is to say to make it operate effectively within a broader frequency range, and especially at low frequency, it is particular advantageous to use the embodiment shown in FIG. 3.

Compared with the embodiment shown in FIG. 1, the driver DISP illustrated in FIG. 3 further includes an additional amplifying circuit IC2A, formed for example from a 74AC140 port connected to the input terminal IN, and also an additional nMOS transistor Q7 connected between ground and the collector of the transistor Q2. The gate of this additional transistor Q7 is connected to the output of the additional amplifying circuit IC2A.

The dynamic behavior due to the values of the capacitor C2 (for example 100 nanofarads), of the resistor R2 (for example 50 ohms) and of the resistor R3 (for example 120 ohms), may not be satisfactory at low frequency since, on a falling edge of the input logic signal, the capacitor C2 charges up through the resistor R2 and through the resistor R3, and ends up by being completely charged so that the transistor Q2 can be turned off again and therefore switch the output at an undesirable instant.

Therefore, to allow the driver to be used acceptably at low frequency, despite this dynamic behavior, which is particularly appropriate for high-frequency reactivity, the additional amplifying circuit IC2A and the additional nMOS transistor Q7 are inserted.

Thus, in a negative half-cycle of the input logic drive signal, the circuit formed from the capacitor C2, the transistor Q1, the resistor R2, the transistor Q2 and the resistor R3 makes it possible to establish a rapid edge on the output. Consequently, the additional circuit IC2A/Q7 maintains a low state on the input of the follower stage Q3/Q4 until the next half-cycle of the input logic signal.

The invention claimed is:

1. A driver for driving a high-voltage transistor, comprising:
    an input terminal for receiving a logic drive signal;
    an output terminal for delivering an output drive signal of the high-voltage transistor;
    an nMOS first drive transistor, which is connected between ground and the output terminal, and including a gate connected to the input terminal; and
    a pMOS second drive transistor connected between a supply terminal and the output terminal, and including a gate connected to the input terminal through a bipolar transistor, a base of the bipolar transistor is directly connected to ground, and the bipolar transistor is current-controlled on its emitter by a capacitive coupling circuit.

2. The driver as claimed in claim 1, in which the high-voltage transistor is a MOS transistor of a radiofrequency high-voltage generator.

3. The driver as claimed in claim 1, in which internal impedance of the nMOS first drive transistor is less than 1 ohm.

4. The driver as claimed in claim 1, in which internal impedance of the nMOS first drive transistor is less than 0.5 ohms.

5. The driver as claimed in claim 1, in which the capacitive coupling circuit comprises a capacitor connected to the input terminal, a first resistor connected to the emitter of the bipolar transistor, and a diode-forming means connected in series between the resistor and the capacitor.

6. The driver as claimed in claim 1, further comprising a resistor connected between the collector of the bipolar transistor and the supply terminal and forming, with the bipolar transistor, a level translator stage and a follower stage connected between the level translator stage and the gate of the pMOS second drive transistor.

7. The driver as claimed in claim 1, further comprising a first amplifying circuit connected between the gate of the nMOS first drive transistor and the input terminal, and a second amplifying circuit connected between the input terminal and the capacitive coupling circuit.

8. The driver as claimed in claim 1, further comprising a phase shift circuit connected between the input terminal and the gate of the nMOS first drive transistor.

9. The driver as claimed in claim 7, further comprising a third amplifying circuit, the input of which is connected to the input terminal, and a second nMOS transistor connected between ground and the collector of the bipolar transistor placed in a common base arrangement, the second nMOS transistor including a gate connected to the output of the second amplifying circuit.

10. Application of the driver as claimed in claim 1 for driving a transistor of a high-voltage radiofrequency generator for spark ignition of an internal combustion engine.

11. Application of the driver as claimed in claim 1 for driving a transistor of a high-voltage radiofrequency generator for plasma generation.

* * * * *